United States Patent

Matsumura et al.

Patent Number: 5,174,801
Date of Patent: Dec. 29, 1992

[54] MANUFACTURE OF QUARTZ GLASS CRUCIBLE FOR USE IN THE MANUFACTURE OF SINGLE CRYSTAL SILICON

[75] Inventors: Mitsuo Matsumura; Hiroshi Matsui, both of Takefu, Japan

[73] Assignee: Shin-EtsuQuartz Products Co. Ltd., Tokyo, Japan

[21] Appl. No.: 717,541

[22] Filed: Jun. 19, 1991

[30] Foreign Application Priority Data

Jun. 25, 1990 [JP] Japan .................. 2-166252
Apr. 24, 1991 [JP] Japan .................. 3-093861

[51] Int. Cl.⁵ .............. C03C 25/04; C03B 19/09; C03B 20/00
[52] U.S. Cl. .................. 65/18.1; 65/60.8; 65/71; 65/144; 65/900
[58] Field of Search ............ 65/18.1, 144, 71, 302, 65/60.8, 57, 900

[56] References Cited

U.S. PATENT DOCUMENTS

| | | |
|---|---|---|
| 4,528,163 | 7/1985 | Albrecht . |
| 4,632,686 | 12/1986 | Brown .................. 65/18.1 |
| 4,713,104 | 12/1987 | Brown .................. 65/18.1 |
| 4,935,046 | 6/1990 | Uchikawa ............. 65/18.1 |
| 4,956,208 | 9/1990 | Uchikawa et al. . |

FOREIGN PATENT DOCUMENTS

| | | |
|---|---|---|
| 0319031 | 12/1988 | European Pat. Off. . |
| 0360659 | 3/1990 | European Pat. Off. . |
| 61-44793 | 3/1986 | Japan . |
| 62-36974 | 8/1987 | Japan . |
| 236723 | 3/1988 | Japan . |
| 63-236723 | 10/1988 | Japan . |
| 1275496 | 6/1989 | Japan . |
| 1-275496 | 11/1989 | Japan . |

Primary Examiner—Robert L. Lindsay
Attorney, Agent, or Firm—Frishauf, Holtz, Goodman & Woodward

[57] ABSTRACT

A quartz glass crucible for use in a process for pulling a single crystal silicon and having an outer layer and an inner layer. The outer layer contains less than 0.3 ppm each of Na, K and Li and more than 5 ppm of Al. The outer layer further contains bubbles to present an opaque appearance. The inner layer is made by melting powders of high purity non-crystalline synthetic silica and contains less then 200 ppm of OH group. There is also disclosed a method for producing the crucible.

5 Claims, 1 Drawing Sheet

MANUFACTURE OF QUARTZ GLASS CRUCIBLE FOR USE IN THE MANUFACTURE OF SINGLE CRYSTAL SILICON

BACKGROUND OF THE INVENTION

1. Field of the Invention

The present invention relates to the manufacture of a quartz glass crucible for use in the manufacture of single crystal silicon. More particularly, the present invention pertains to a structure and a method for manufacturing a quartz glass crucible having inner and outer layers of different properties.

2. Description of Prior Art

In a so-called Czochralski process for pulling a single crystal silicon, use is made of a quartz glass crucible for storing molten silicon. Such type of crucible is usually made of natural crystalline or non-crystalline quartz. The quartz is crushed and refined to produce refined quartz powder which is formed into a shape of a crucible in a rotatable mold and heated at the inner wall by means of an arc discharge while the mold is being rotated. The preformed quartz powder is molten under the heat of the arc discharge and after a predetermined time of the heating it is cooled down to form a quartz glass crucible having a smooth inner wall surface.

The crucible thus formed generally contains a lot of fine bubbles or voids in the wall so that it has an opaque appearance. It is believed that the wall structure having a lot of fine bubbles or voids shows a relatively uniform thermal conductivity. It is also believed important for making stable the process of pulling a single crystal silicon that the quartz glass crucible for use in this process has the bubble structure and a smooth inner wall surface.

The inventors have made an extensive investigation to provide a quartz crucible of improved property and already proposed a crucible of a two layer structure in U.S. Pat. Nos. 4,935,046 and 4,956,208. According to the crucible structure proposed by the U.S. patents, the crucible has an inner layer of a predetermined thickness such as 0.5 mm to 2 mm, which is substantially free from bubbles or voids and an outer layer of the aforementioned opaque structure having a lot of bubbles. The U.S. patents also disclose a novel process for manufacturing a crucible of the aforementioned two layers structure.

The quartz glass crucible disclosed by the U.S. patents has been found advantageous in that it can significantly decrease roughening of the inner wall surface of the crucible which may otherwise be produced in the process of pulling the single crystal silicon. It has also been found that the crucible structure of the U.S. patents is effective to decrease crystobalites which may be produced on the crucible in a process which uses a conventional crucible. As a result, the crucible in accordance with the U.S. patents is effective to make the process for pulling the single crystal silicon stable and to improve the production yield to a remarkable extent.

In recent years, production of super LSI has been increased. For the production of the super LSI, it is necessary to use a silicon wafer of a high quality. In order to provide a steady supply of high quality silicon wafers, it is required to provide a quartz glass crucible of high purity. In view of the requirement, proposals have been made to use powders of synthetic quartz instead of the powders of natural quartz. For example, the U.S. Pat. No. 4,528,163 discloses a quartz crucible having an outer structure made of powders of natural quartz and an inner lining layer made of powders of synthetic quartz, the inner lining layer being formed on the inner surface with a thin layer of smooth non-crystalline structure.

It should however be noted that the innermost layer of the structure disclosed by this U.S. patent is very thin and may not be thicker than 0.1 mm. The remainder of the structure has a lot of bubbles or voids. Therefore, the crucible cannot be used for a prolonged time in a plurality of processes of pulling the single crystal silicon.

The Japanese patent publication Sho 62-36974 discloses process of manufacturing a glass product from a synthetic quartz by forming silicon tetrachloride of high purity into a configuration of the product, sintering the thus formed product, heating it at the surface to have the wall of the product molten and cooling the product to obtain a glass product such as a quartz crucible. The Japanese laid-open patent application Sho 61-44793 discloses a process for manufacturing a quartz glass crucible having an inner layer made of powders of a synthetic quartz. According to the teaching of the Japanese patent application, a molded crucible is prepared from material powders to have an inner layer made of powders of a synthetic quartz containing more than 200 ppm of OH group and an outer layer made of powders of natural crystalline quartz containing less than 100 ppm of OH group, and the molded crucible is then heated to be molten while it is rotated.

It should however be noted that the process disclosed by either of these Japanese patent applications cannot provide a crucible having a wall of satisfactory transparency even if the inner wall surface of the crucible is molten as described so that the crucible produced by this process cannot provide a stable process for pulling a single crystal silicon. The crucible produced by the process taught by either of the aforementioned two Japanese patent applications does not have a transparent inner layer of a thickness greater than 0.5 mm and substantially free from bubbles or voids as in the crucibles disclosed by the aforementioned U.S. Pat. Nos. 4,935,046 and 4,956,208.

In forming a silica glass layer from a synthetic material, use may be made of crystalline synthetic silica as a starting material. However, this process may be uneconomical because the crystalline silica is very expensive since it is made by a process including a lot of steps. For example, it is usually made of ester silane or sodium silicate through hydrolysis, or of silane halides through hydrolysis to produce non-crystalline silica which is thereafter crystallized by means of a high temperature devitrification using a crystallizing core such as an alkali.

Synthetic silica powders are generally of non-crystalline structure so that they can be economically used for forming a glass layer. However, it has been recognized that powders of non-crystalline silica do not have a uniform melting point so that it is difficult to obtain a smooth surface in forming a glass layer.

SUMMARY OF THE INVENTION

It is an object of the present invention to provide a method for producing a quartz glass crucible having an outer layer containing a lot of bubbles or voids and an inner layer of a thickness greater than 0.5 mm and substantially free from bubbles, the inner layer being made of synthetic silica glass of high purity.

Another object of the present invention is to provide a quartz glass crucible of novel structure.

A further object of the present invention is to provide a method for producing a quartz glass crucible using powders of synthetic silica glass of high purity.

A still further object of the present invention is to provide a method for producing a quartz glass crucible having a high mechanical strength but which can provide a stable process of pulling single crystal silicon.

A further object of the present invention is to provide a quartz glass crucible which can produce single crystal silicon of high quality.

According to the present invention, the above and other objects can be accomplished by a method of producing a quartz glass crucible for use in a process of pulling a single crystal silicon, the method including steps of forming a body of a configuration of a crucible from powders containing natural quartz, heating said body at an inner wall surface to have the body molten at least partially to provide a crucible basic structure having a lot of visible bubbles, forming a high temperature atmosphere in said crucible basic structure, supplying into said high temperature atmosphere powders of amorphous synthetic silica of high purity containing less than 170 ppm of OH group to have the powders of amorphous silica molten at least partially and deposited on the inner wall surface of said crucible basic structure to thereby form on the inner wall surface of said crucible basic structure an inner layer of transparent synthetic silica glass of a predetermined thickness.

The crucible basic structure may be made of powders of natural quartz only or a mixture of powders of natural quartz and powders of synthetic silica. According to a preferable aspect of the present invention, the powders of amorphous silica used to form the inner layer has a specific surface area of 5 m$^2$/g.

According to a further aspect of the present invention, there is also provided a quartz glass crucible for use in a process of pulling a single crystal silicon, said crucible having an outer layer portion and an inner layer portion, said outer layer portion being of a quartz glass containing a lot of bubbles and containing respectively less than 0.3 ppm of Na, K and Li and more than 5 ppm of Al, said inner layer portion being a transparent silica glass layer which is made by melting powders of amorphous synthetic silica of high purity and contains less than 200 ppm of OH group. The inner layer portion preferably has a thickness of at least 0.5 mm. The outer layer portion may contain at an outer surface portion crystalline quartz components.

In the method of the present invention, it may be possible in forming the outer layer portion to use a mixture of powders of natural quartz and powders of amorphous synthetic silica. In this instance, it is preferable that the mixture contains more than 5 ppm of Al. In order to obtain the inner layer portion of transparent synthetic silica glass containing less than 200 ppm of OH group in the final product of the crucible, it is important that the powders for forming the inner layer portion contain less than 170 ppm of OH group.

In carrying out the method of the present invention, the body of the configuration of the crucible may be provided in a rotating die and heat is applied to the inner wall surface of the body to have the powders molten at least partly so that the basic crucible structure is formed. When or after the basic structure is formed, the transparent silica glass layer is formed by forming a high temperature atmosphere in the basic structure and supplying into the atmosphere powders of amorphous silica of high purity containing less than 170 ppm of OH group while the die is being rotated. The powders of the amorphous silica are molten at least partly and splashed toward the inner wall surface of the outer layer portion and deposited thereon to form an inner layer of transparent silica glass substantially free from bubbles and containing less than 200 ppm of OH group.

According to a preferable aspect of the present invention, the amorphous silica powders may be of non-porous nature. Non-porosity may be determined on the basis of specific surface area and the preferable porosity in the method of the present invention is less than 5 m$^2$/g According to the present invention, the quartz glass crucible has an outer layer portion which contains a lot of bubbles and is made by melting powders of natural quartz or a mixture of powders of natural quartz and powders of amorphous synthetic silica, the powders containing Na, K and Li of which quantities are respectively less than 0.3 ppm, the powders further containing Al in a quantity greater than 5 ppm. The outer layer portion thus formed to have a lot of bubbles assures a uniform thermal conductivity from a heat source which may be provided outside the crucible to the inside of the crucible. Further, the outer layer portion is effective to increase the mechanical strength of the crucible. By providing the outer layer portion with crystalline quartz locally distributed at the outer portion of the layer, it is possible to decrease a thermal deformation which may be produced when the crucible is used for the process of pulling a single crystal silicon.

The Al content in the outer layer portion should be greater than 5 ppm but there is no substantial upper limit. It should however be noted that the Al content in crystalline quartz which is generally available in nature is utmost 60 ppm. Further, the property of the crucible is not significantly improved even if the Al content is increased beyond 60 ppm. Therefore, the practical and preferable range of Al in the outer layer is 5 to 60 ppm.

Alkali elements such as Na, K and Li tend to be diffused in a quartz glass layer relatively rapidly under a high temperature so that they can be diffused even into the inner layer portion to apply an adverse effect on the inner layer. Such elements may also have an adverse effect on the single crystal silicon which may be produced using the crucible. Therefore, it is required that the concentration of each of these elements in the outer layer portion is less than 0.3 ppm.

The inner layer portion is of a transparent synthetic silica glass of at least 0.5 mm thick containing less than 200 ppm of OH group. The inner layer portion is made by melting powders of amorphous silica of high purity. The inner layer portion thus formed is of extremely high purity having an OH group concentration within a limited range. The inner layer portion of this nature is effective to provide a uniform quantity of the material of the inner layer portion which is molten into the bath of molten silicon in the crucible during the process of pulling a single crystal silicon. It is therefore possible by using the crucible having the inner layer portion of this nature to suppress turbulence of the surface of the molten silicon bath. As a result, it is possible to carry out the pulling process in a stable manner to accomplish a high yield of a single crystal silicon of high quality with minimum defects.

According to the method of the present invention, the basic crucible structure of quartz glass containing a lot of bubbles is formed in a rotating die. While the structure is being formed or after it is formed, a high temperature atmosphere is formed in the structure by means for example of an arc discharge to make the inner wall surface of the basic crucible structure molten or softened. With this state, powders of amorphous synthetic silica are supplied to the high temperature atmosphere. The silica powders are molten at least partly and splashed toward the inner wall surface of the crucible and deposited on the inner surface of the crucible structure which is in a molten or softened condition. The deposits form an inner layer of a predetermined thickness of transparent synthetic silica glass which is substantially free from bubbles.

It is important that the powders of amorphous synthetic silica are of high purity and contain less than 170 ppm of OH group. It is also preferable that the powders of amorphous synthetic silica are of a non-porous nature. If the powders of silica glass are of a porous microstructure, the inner glass layer may contain a lot of bubbles when it is formed by supplying the powders into the high temperature atmosphere to have them molten and deposited onto the inner wall surface of the basic crucible structure. Therefore, it will not be possible to obtain a transparent glass layer which is substantially free from bubbles.

According to a preferable aspect of the present invention, the powders of amorphous, non-porous synthetic silica are supplied at a rate of 300 g/min. Heat is applied at the inside of the crucible structure so that the silica powders thus supplied are molten to form a transparent glass layer substantially free from bubbles. It is possible to avoid problems of conventional methods using synthetic silica glass powders.

With the powders of amorphous silica containing more than 170 ppm of OH group, it may be possible to form a transparent glass layer. It should however be noted that there is a tendency that the OH group concentration in the final product is increased to a certain extent greater than the concentration in the powders. Therefore, the OH group concentration in the final product will be more than 200 ppm if the concentration in the powders is more than 170 ppm. If the OH group concentration in the inner layer of the crucible is more than 200 ppm, there will be produced turbulence in the surface of the molten bath of silicon during the pulling process. Such turbulence is not preferable because it will cause variations in diameter of the single crystal silicon which is being pulled. Further, the turbulence causes an increase in the defects of the single crystal silicon. With the OH group concentration greater than 500 ppm in the inner layer of the crucible, there will often be produced break down of the silicon rod when it is being pulled.

Amorphous synthetic non-porous silica powders of high purity containing OH group of a quantity less than a predetermined value can readily be obtained by a conventional process. For example, they may be provided through a so-called sol-gel (solation-gelation) process in which materials such as tetraalchoxysilane like tetramethoxysilane or teteraethoxsilane, or silicon tetrahalide are subjected to produce silica. Alternatively, silica may be produced through a flame hydrolysis or other known process. Then, silica thus obtained may be crushed to produce powders, or silica may be converted into a transparent glass form by means of a degassing melting process and crushed to obtain non-porous silica powders.

The above and other objects and features of the present invention will become apparent from the following description of a preferred embodiment taking reference to the accompanying drawings.

DESCRIPTION OF THE PREFERRED EMBODIMENT

Figure 1:
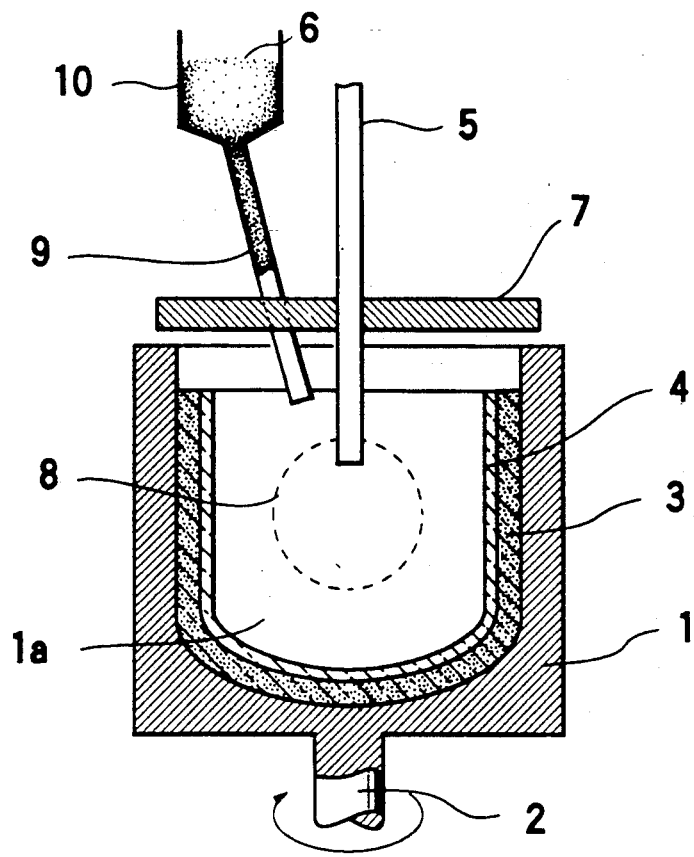
FIG. 1 is a sectional view of an apparatus for carrying out the method in accordance with the present invention; and, FIG. 2 is partially cut-away perspective view of a quartz glass crucible in accordance with the present invention.

Referring to the drawings, particularly to FIG. 1, there is shown a rotatable die 1 which is provided with a rotatable shaft 2. The rotatable die 1 has a die cavity 1a defined therein. In the die cavity 1a, there is disposed a quartz glass crucible basic structure 3 which contains a lot of bubbles. The basic structure 3 may be produced in the die 1 from powders of natural crystalline quartz containing less than 0.3 ppm each of Na, K and Li and more than 5 ppm of Al. Alternatively, the basic structure 3 may be made of powders of non-crystalline synthetic silica of the same Na, K, Li and Al concentration. The powders are preformed in the die 1 into a configuration of a crucible to provide a preformed body which is then heated at the inside surface to have the powders at least partially molten. After cooling, an opaque crucible basic structure 3 is obtained. The basic structure thus obtained contains a lot of bubbles or voids so that it presents an opaque appearance.

In order to form a crucible of the present invention, the basic structure 3 held in the rotatable die 1 is rotated together with the die 1 and a heat source 5 is inserted into the structure 3. The basic structure 3 is opened at the top end and the top opening in the basic structure 3 is closed by means of a closure 7 with an annular gap left around the closure 7. The heat source 5 functions to produce a high temperature atmosphere 8. Powders 6 of non-crystalline synthetic silica of high purity containing less than 170 ppm of OH group are supplied by a controlled amount through a nozzle 9 to the high temperature atmosphere 8. According to the present invention, the silica powders 6 thus supplied are of non-crystalline structure and contain less than 170 ppm of OH group as already described. It is preferred in order to form on the inner wall surface of the basic structure 3 an inner layer of a perfectly transparent silica glass to use powders of non-porous nature. According to the present invention, it is preferred that the synthetic silica powders are of a size between 30 and 1000 μm. More preferable powder size is between 100 and 300 μm. Preferable porosity of the powders 6 is 5 m$^2$/g.

The synthetic silica powders 6 are supplied toward the inner surface of the basic crucible structure 3. At least a part of the powders 6 are molten before they reach the inner surface of the basic structure 3. The inner surface of the basic structure is also in a molten state by the time the powders 6 reach there. The silica powders 6 thus supplied are therefore deposited on the inner wall surface of the crucible basic structure 3 and form a layer 4 of transparent synthetic silica glass which is integral with the basic structure and substantially free from bubbles.

The synthetic silica powders 6 are supplied from a supply vessel 10 through a metering feeder (not shown) and the nozzle 9. In the embodiment shown in FIG. 1, a preformed opaque crucible basic structure 3 is placed in the die 1 and the aforementioned transparent silica glass layer 4 is formed on the inner wall surface of the basic structure 3 by means of the process described above. It should however be noted that the inner transparent silica glass layer 4 may be formed together with the opaque crucible basic structure 3. For that purpose, powders of natural crystalline quartz or a mixture of powders of natural crystalline quartz and powders of non-crystalline silica may be supplied to the rotating die 1 and shaped along the inner wall surface of the die 1 to provide a layer of powders of a predetermined thickness. Heat is then applied to the inner surface of the powder layer to have the powders molten at least partly to form a glass layer containing a lot of bubbles. When the process is being progressed, the aforementioned process for producing the transparent silica glass layer may be performed. According to this alternative process, an atmosphere of high temperature is produced when the opaque glass crucible basic structure is being formed and the powders 6 of the synthetic silica are supplied to this atmosphere. Further, the alternative process is advantageous in that the crucible basic structure 3 can be formed with the same die 1 which is used to form the inner layer 4. It is further possible in forming the basic structure 3 to control the heat applied to the powders so that the powders in the powder layer may not be totally converted into a glass form but natural crystalline quartz structure may be presented at the outer surface portion of the basic structure 3. In forming such crystalline structure, the outer portion of the basic structure 3 may be cooled if necessary.

As a means for heating the powder layer 3 and the silica powders 6, an arc discharge device having electrodes such as carbon electrodes 5 may advantageously be used. For producing the arc discharge, at least two electrodes 5 are required. It is possible to produce a desired arc discharge by using three electrodes 5. By an appropriate adjustment of the gap between the electrodes 5 and the distance between the electrodes 5 and the crucible basic structure 3, it is possible to control the melting condition of the powders in an appropriate manner to form the transparent glass layer 4. The closure 7 is used for controlling the temperature in the basic crucible structure 3. It is important to provide the annular gap between the closure and the die 1 so that extremely fine powders and vapors of silica may be allowed to be exhausted from the die 1.

Figure 2:
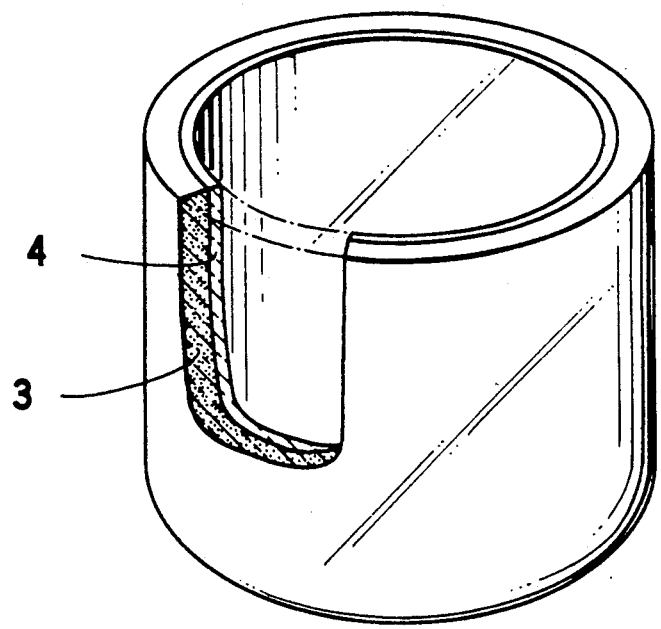

Referring now to FIG. 2, there is shown a quartz glass crucible made in accordance with the process described above. As already described, the crucible has an outer layer 3 of a quartz glass containing a lot of bubbles and an inner layer 4 of non-crystalline synthetic silica of high purity. The inner layer 4 is of a transparent synthetic silica glass containing less than 200 ppm of OH group and of a thickness greater than 0.5 mm. The outer layer 3 contains less than 0.3 ppm each of Na, K and Li and more than 5 ppm of Al.

EXAMPLES

Example 1

Powders of natural crystalline quartz of a powder size in the range of 100 to 300 μm are supplied to a rotating die to form a powder layer of 14 mm thickness. The powder layer is then heated by an arc discharge at the inner surface to have the inner surface portion of the power layer molten. At the same time, powders of non-crystalline synthetic silica are supplied to the high temperature atmosphere formed by the arc discharge in the rotating die so that the silica powders are deposited on the inner surface of the preformed powder layer to form a transparent silica glass layer of 1 mm thickness. Thus, a quartz glass crucible of 14 inch diameter and 7.9 mm wall thickness is produced.

In the example, the natural crystalline quartz powders containing 0.16 ppm of Na, 0.10 ppm of K, 0.22 ppm of Li and 8.2 ppm of Al are used for providing the outer glass layer. The powders of high purity non-crystalline synthetic silica for providing the inner glass layer are of a powder size of 100 to 300 μm. The specific surface area and the OH group concentration of the inner glass layer are varied to investigate their effects. The results are shown in Table 1.

TABLE 1

| sample No. | non-crystalline silica powders | | appearance of crucible |
|---|---|---|---|
| | specific surface area | OH group | |
| sample 1 | 0.5 | 62 | transparent inner layer bubble free |
| sample 2 | 0.5 | 161 | same as above |
| sample 3 | 1 | 43 | same as above |
| sample 4 | 4 | 73 | same as above |
| comp. 1 | 0.5 | 250 | transparent inner layer bubble free |
| comp. 2 | 0.5 | 620 | same as above |
| comp. 3 | 8 | 63 | opaque inner layer with bubbles |

Example 2

The crucibles of Example 1 are used to carry out the Czochralski process for pulling a single crystal silicon. With the use of each crucible, three ingots of single crystal silicon of 6 inches diameter and 30 Kg weight are pulled sequentially. Average ratio of single crystal in each ingot is measured. The results are shown in Table 2.

TABLE 2

| sample No. | 1st | 2nd | 3rd |
|---|---|---|---|
| sample 1 | 100 | 90 | 80 |
| sample 2 | 90 | 90 | 70 |
| sample 3 | 90 | 90 | 70 |
| sample 4 | 90 | 80 | 70 |
| comp. 1 | 90 | 50 | — |
| comp. 2 | 80 | 40 | — |
| comp. 3 | 80 | 50 | — |

In the example described above, it will be noted that the crucibles made in accordance with the present invention can produce single crystal silicon ingots in a reliable and stable manner.

In the comparative examples 1 and 2, it has been recognized that a turbulence has been produced in the second stroke of the process and that the crucible has been bulged with a danger of leakage of molten quartz. Therefore, the third stroke of the pulling process could not be carried out. In the comparative example 3, instability of the pulling process has been observed even in the second stroke. Therefore, it has not been possible to proceed to the third stroke. It has further been recognized that there has been significant wear in the inner surface, particularly at the area which has been in contact with the surface of the molten silicon bath so that the transparent inner layer has been already lost.

It is important to note that with the samples 1, 2, 3 and 4 made in accordance with the present invention it has been investigated that even after the third stroke of the pulling process the transparent inner layer has been left.

Example 3

A comparative sample 4 is produced in accordance with the process condition as in the Example 1 but using powders of crystalline quartz containing 0.41 ppm of Na, 0.20 ppm of K, 0.21 ppm of Li and 17.9 ppm of Al as impurities for forming the outer layer. A comparative sample 5 is produced in the same manner but using powders of crystalline quartz containing 0.30 ppm of Na, 0.45 ppm of K, 0.24 ppm of Li and 18.7 ppm of Al as impurities for forming the outer layer. A comparative sample 6 is also produced in the same manner with powders of crystalline quartz containing 0.18 ppm of Na, 0.08 ppm of K, 1.9 ppm of Li and 3.5 ppm of Al as impurities for producing the outer layer. Test results are shown in Table 3.

TABLE 3

| sample No. | average ratio of single crystal (%) | | |
|---|---|---|---|
| | 1st | 2nd | 3rd |
| sample 1 | 100 | 90 | 80 |
| cpmp. 4 | 100 | 90 | 70 |
| comp. 5 | 100 | 90 | 70 |
| comp. 6 | 90 | 50 | — |

In the comparative example 6, it has been investigated that the crucible has been bulged in the second stroke of the pulling process so that the third stroke has not been carried out.

The single crystal silicon ingots produced by the first and third strokes of the pulling process using the crucible of the sample 1 of the present invention and the comparative samples 4 and 5 have been subjected to further tests for determining the specific resistance and the oxygen concentration at the center parts. The results are shown in Table 4.

TABLE 4

| sample | | spec. resis. (Ωcm) | oxy. conc. ($\times 10^{18}$ atm/cc) |
|---|---|---|---|
| sample 1 | 1st | 1300 | 1.6 |
| | 3rd | 1200 | 1.5 |
| comp. 4 | 1st | 1300 | 1.8 |
| | 3rd | 300 | 1.6 |
| comp. 5 | 1st | 1200 | 1.9 |
| | 3rd | 180 | 1.7 |

In Table 4, it will be noted that the single crystal silicon produced by the sample 1 of the present invention shows a stable resistance value and a stable oxygen concentration. To the contrary, with the comparative examples 4 and 5, there is a remarkable decrease in the resistance value in the third stroke of the pulling process.

Example 4

Powders of natural crystalline quartz as used for providing the sample 1 of Example 1 are put into a rotating die to form a quartz powder layer. Powders of non-crystalline synthetic silica are then supplied to form an inner silica powder layer. Thereafter, the powder crucible body thus produced is heated at the inner surface by means of an arc discharge to produce a quartz crucible of 8 mm thick and 14 inches in diameter. There was no visible transparent inner glass layer. Similar tests have been made as in the Example 2 to determine the ratio of single crystal silicon on the ingots produced using the crucible. The ratio is 80% in the first stroke and 50% in the second stroke of the pulling process.

Example 5

A mixture of powders of natural crystalline quartz and powders of non-crystalline synthetic silica was prepared for producing the outer layer of the crucible. The natural quartz powders were of a powder size of 100 to 300 μm and contain 0.21 ppm of Na, 0.13 ppm of K, 0.19 ppm of Li and 11.4 ppm of Al. The silica powders were of a powder size of 100 to 300 μm and contain less than 0.01 ppm of Na, less than 0.05 ppm of K, less than 0.01 ppm of Li, less than 0.02 ppm of Al, less than 0.05 ppm of Fe and less than 0.01 ppm of Cu with the specific surface area of 0.4 m$^2$/g. The mixing ratio was 1:1. The same silica powders were also prepared for forming the inner glass layer.

A crucible was produced in accordance with the process of Example 1 and tests were made as in the Example 2. The results were the same as in the sample 1 shown in Table 2.

From the above description, it will be noted that the present invention can provide a quartz crucible which has an extremely high heat resistance. The crucible in accordance with the present invention does not produce any deformation under a temperature which the crucible will be subjected to in the course of a process for pulling a single crystal silicon. The wear at the inner surface is very small so that it is possible to maintain a high value of single crystal in the ingots produced using the crucible of the present invention. The crucible can be used in a repeated pulling process without loosing the quality of the silicon products. The crucible of the present invention can be produced economically because the transparent inner layer can be formed by using synthetic silica glass powders which can be produced through an industrially economical process.

The invention has thus been shown and described with reference to a specific embodiment, however, it should be noted that the invention is in no way limited to the details of the illustrated embodiment but changes and modifications may be made without departing from the scope of the appended claims.

We claim:

1. A method for producing a quartz glass crucible for use in a process for pulling a single crystal silicon, said method comprising the steps of:

supplying powders containing natural crystalline quartz to form a powder layer of a crucible configuration, heating an inner surface of said powder layer having said crucible configuration so that the inner surface of said powder layer is molten so as to thereby form a crucible basic structure containing bubbles and having an inner surface, forming a high temperature atmosphere in said crucible basic structure during or after the step of forming the crucible basic structure, and supplying into the high temperature atmosphere powders of high purity non-crystalline synthetic silica containing less than 170 ppm of OH group so that at least a part of said powders of synthetic silica are molten and are deposited on said inner surface of the crucible basic structure so as to form said inner surface of the crucible basic structure with a transparent synthetic silica glass layer of a predetermined thickness.

2. A method in accordance with claim 1 in which said powders of high purity non-crystalline synthetic silica are of a specific surface area less than 5 m²/g.

3. A method in accordance with claim 1 in which said powders of high purity non-crystalline synthetic silica are of powder size of 30 to 1000 μm.

4. A method in accordance with claim 1 in which said step of supplying powders includes the step of supplying a mixture of powders of said natural crystalline quartz and powders of synthetic silica, to form said powder layer of said crucible configuration.

5. A method in accordance with claim 1 in which said powders of high purity non-crystalline synthetic silica are non-porous.

* * * * *